(12) United States Patent
Wang et al.

(10) Patent No.: US 11,916,479 B2
(45) Date of Patent: Feb. 27, 2024

(54) SWITCHING CONVERTER WITH ANALOG ON-TIME EXTENSION CONTROL

(71) Applicant: TEXAS INSTRUMENTS INCORPORATED, Dallas, TX (US)

(72) Inventors: Zejing Wang, Shanghai (CN); Zhujun Li, Shanghai (CN); Songming Zhou, Shanghai (CN); Yu Wang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/082,274

(22) Filed: Dec. 15, 2022

(65) Prior Publication Data

US 2023/0208293 A1     Jun. 29, 2023

Related U.S. Application Data

(63) Continuation of application No. 17/010,418, filed on Sep. 2, 2020, now Pat. No. 11,557,969, which is a continuation of application No. PCT/CN2020/082930, filed on Apr. 2, 2020.

(51) Int. Cl.
| | |
|---|---|
| *H02M 3/157* | (2006.01) |
| *H02M 1/08* | (2006.01) |
| *H02M 3/158* | (2006.01) |
| *H02J 7/00* | (2006.01) |

(52) U.S. Cl.
CPC ............ *H02M 3/157* (2013.01); *H02M 1/08* (2013.01); *H02M 3/158* (2013.01); *H02J 7/007* (2013.01); *H02J 2207/20* (2020.01)

(58) Field of Classification Search
CPC ......... H02M 3/157; H02M 3/158; H02J 7/007
See application file for complete search history.

(56) References Cited

U.S. PATENT DOCUMENTS

| 8,669,747 | B2 | 3/2014 | Fang |
| 9,654,011 | B2* | 5/2017 | Chen ...................... H02H 3/027 |
| 10,333,403 | B2 | 6/2019 | Huang |
| 10,333,417 | B2* | 6/2019 | Song ................. H02M 3/33592 |
| 11,557,969 | B2* | 1/2023 | Wang ...................... H02M 1/08 |
| 2008/0088284 | A1 | 4/2008 | Weng |
| 2014/0340064 | A1 | 11/2014 | Hsiao |
| 2016/0268907 | A1 | 9/2016 | Chen |

(Continued)

OTHER PUBLICATIONS

PCT International Search Report dated Jan. 1, 2021.

*Primary Examiner* — Kyle J Moody
(74) *Attorney, Agent, or Firm* — Ray A. King; Frank D. Cimino

(57) ABSTRACT

A system includes: 1) a battery configured to provide an input voltage (VIN); 2) switching converter circuitry coupled to the battery, wherein the switching converter circuitry includes a power switch; 3) a load coupled to an output of the switching converter circuitry; and 4) a control circuit coupled to the power switch. The control circuit includes: 1) a switch driver circuit coupled to the power switch; 2) a summing comparator circuit configured to output a first control signal that indicates when to turn the power switch on; and 3) an analog on-time extension circuit configured to extend an on-time of the power switch by gating a second control signal with the first control signal, wherein the second control signal indicates when to turn the power switch off.

16 Claims, 12 Drawing Sheets

(56) References Cited

U.S. PATENT DOCUMENTS

| | | |
|---|---|---|
| 2017/0187282 A1 | 6/2017 | Wang |
| 2019/0379289 A1 | 8/2019 | Xie |
| 2019/0319526 A1 | 10/2019 | Yang |
| 2021/0050790 A1 | 2/2021 | Talari |

\* cited by examiner

SWITCHING CONVERTER WITH ANALOG ON-TIME EXTENSION CONTROL

CROSS-REFERENCE TO RELATED APPLICATIONS

This application is a divisional of U.S. patent application Ser. No. 17/010,418, filed Sep. 2, 2020, now U.S. Pat. No. 11,557,969, which is a continuation of PCT/CN2020/082930, filed Apr. 2, 2020, all of which are incorporated herein by reference in their entirety.

BACKGROUND

There are many different electrical system designs, each appropriate for a given scenario. Efforts to improve on electrical system designs and components are ongoing and involve commercialization of different system components. The use of semiconductor technology and the proliferation of consumer and industrial applications for semiconductor-based circuits drive product development. In summary, there is a competition to provide low-cost and functional electrical system components for use in consumer and industrial applications around the world.

Power management circuits are needed for many electrical system designs. In particular, the proliferation of mobile battery-operated devices is tied to the commercialization of the power management circuits. One type of power management circuit is referred to as a switching converter. Ina switching converter, the output voltage is a function of the input voltage and the switching operations of one or more switches. One benefit of a switching converter is its ability to respond to a variable load.

One of the challenges in a battery-operated electrical system device is that the input voltage will drop over time. Thus, one design goal for a switching converter is to account for drops in the input voltage while maintaining a stable output voltage. The combination of a dropping or variable input voltage as well as a variable load increases the design goal complexity.

SUMMARY

In accordance with at least one example of the disclosure, a system comprises a battery configured to provide an input voltage (VIN). The system also comprises switching converter circuitry coupled to the battery and a load coupled to an output of the switching converter circuitry. The system also comprises a control circuit coupled to the power switch. The control circuit comprises a switch driver circuit coupled to the power switch. The control circuit also comprises a summing comparator circuit configured to output a first control signal that indicates when to turn the power switch on. The control circuit also comprises an analog on-time extension circuit configured to extend an on-time of the power switch by gating a second control signal with the first control signal, wherein the second control signal indicates when to turn the power switch off.

In accordance with at least one example of the disclosure, a switching converter includes a power switch and a switch driver circuit coupled to the power switch. The switching converter also includes a control circuit coupled to the switch driver circuit. The control circuit comprises a summing comparator circuit and an on-time signal generator circuit. The control circuit also comprises an AND gate with a first input node, a second input node, and an output node. The first input node of the AND gate is coupled to an output of the summing comparator circuit via an inverter. The second input node of the AND gate is coupled to an output of the on-time signal generator circuit. wherein an output of the AND gate is coupled to the switch driver circuit. The output node of the AND gate is coupled to the switch driver circuit.

In accordance with at least one example of the disclosure, a switching converter controller comprises a latch and an analog on-time extension circuit with an AND gate. A first input node of the AND gate is configured to receive an inverted on-time signal. A second input node of the AND gate is configured to receive an off-time signal. The output node of the AND gate is coupled to the latch.

BRIEF DESCRIPTION OF THE DRAWINGS

For a detailed description of various examples, reference will now be made to the accompanying drawings in which.

DETAILED DESCRIPTION

Figure 1:
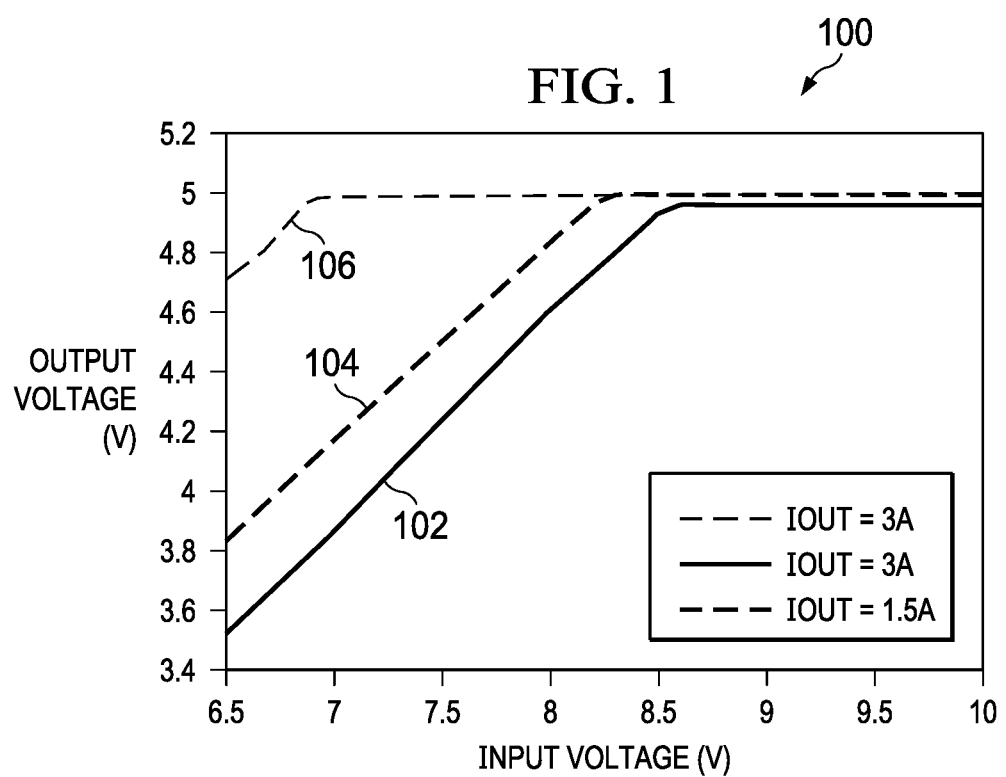
FIG. 1 is a graph showing switching converter output voltage as a function of input voltage in accordance with some examples.

Disclosed herein are switching converter topologies with an analog on-time extension circuit. In one example, a switching converter includes a power switch, a switch driver circuit coupled to the power switch, and a control circuit coupled the switch driver circuit. In operation, the control circuit directs the switch driver circuit regarding when to turn the power switch on and when to turn the power switch off. In another example, a switching converter includes multiple power switches, a switch driver circuit for each of the power switches, and a control circuit configured to direct the switch driver circuits regarding when to turn each of the power switches on or off. In one switching converter topology, a set of power switches (S1, S2) are used, where example states for S1 and S2 include a high-side on state (S1 on, S2 off), a low-side on state (S1 off, S2 on), and a pause state (S1 off, S2 off). In such examples, a control circuit determines when to use the high-side on state, the low-side on state, or the pause state. Regardless of whether one more power switches are used, a control circuit may be understood to have different modes of operation. Broadly speaking, regardless of the particular modes of operation in use, the control circuit is configured to determine when to turn on or turn off a power switch depending on parameters such as load variance, input voltage (VIN) variance, and output voltage (VOUT) variance. At the circuit level, such parameters are monitored, changes are detected, the detected values or changes in values are compared with thresholds, and related signals are generated.

In some examples, a control circuit may be understood to adjust the timing of power switch states (e.g., on state, off state) by adjusting an on-time signal, by adjusting an off-time signal, by gating the on-time signal, and/or by gating the off-time signal. Consistent with the present disclosure, gating a given signal may encompass passing the given signal to a logic gate (e.g., an AND gate), which also receives another input signal such that propagation of the given signal beyond the logic gate depends on the other signal. The present disclosure introduces an analog on-time extension feature that is compatible with the different modes of operation and the available signals of the disclosed switching converter topologies. Example modes of operation include a valley control mode, in which the control circuit determines an on-time signal for a power switch based on ramp compensation and a reference voltage. The valley control mode is used, for example, when an input voltage (VIN) is above a threshold. Also, ramp compensation is a tringle source injected in the comparator in order to cancel jitter. Once VIN drops below a threshold and/or other criteria, the control circuit transitions from the valley control mode to a peak control mode. During the peak control mode, the on-time signal for a power switch is determined without ramp compensation. Between the valley control mode and the peak control mode is a transition interval. When an input voltage sweep is performed, the length of transition interval is decided by the sweep slope of VIN. In the disclosed examples, the on-time extension feature uses the available on-time signal (which varies depending on ramp compensation being on or off), an available off-time signal (which varies depending on VIN and VOUT), and appropriate gating of the on-time signal and off-time signal. As desired, to ensure inductor current stability during the transition interval, ramp compensation may be on/off modulated.

In some examples, the control circuit for a switching converter includes a summing comparator circuit which decides when the high side switch is on as well as an on-time signal generator circuit which decides when the high-side switch is off. The summing comparator circuit corresponds to a voltage regulation loop that includes a comparator with a reference voltage input and a feedback input. The reference voltage input receives a target reference voltage (VREF) modified by ramp compensation. The feedback input receives a feedback voltage modified by ripple. In operation, the summing comparator circuit provides an on-time signal that indicates when the power switch should be turned on to regulate the feedback voltage to VREF. Even when the on-time signal is high, the control circuit may gate the on-time signal with a minimum off-time signal.

In some examples, the summing comparator circuit includes a ramp compensation control circuit with a ramp switch and a ramp switch controller. In such examples, the ramp switch controller provides a control signal to the ramp switch based on gating an off-time signal (e.g., from the on-time signal generator circuit) with an on-time signal (e.g., from the summing comparator circuit). In one example, a D latch is used to gate the off-time signal with the on-time signal, where the output of the D latch is used to control the ramp switch. With the ramp compensation control circuit, ramp compensation is used (the ramp switch is closed or in an on state) during a first mode (e.g., during a valley control mode) when VIN is higher than a threshold. When VIN drops below the threshold, the ramp compensation control circuit on/off modulates the ramp compensation (the ramp switch cycles between on and off states) during a transition interval to maintain inductor current stability. Once the transition interval is complete, the ramp compensation control circuit turns off ramp compensation (the ramp switch stays open) and an on-time extension cycle is performed. In some examples, once VOUT begins to increase or is higher than a threshold, the on-time extension cycle ends, and voltage regulation continues using the on-time signal, the off-time signal, and related modes.

In some examples, the control circuit also includes an on-time extension circuit with an AND gate (separate from a second AND gate used to specify a minimum off-time), where a first input node of the AND gate is coupled to an output of the summing comparator circuit via an inverter, and where the second input node of the AND gate is coupled to an output of the on-time signal generator circuit. The output of the AND gate is provided to a latch (e.g., an SR latch) included with or coupled to a switch driver circuit, where the output of the latch is used to control a switch driver circuit. With the AND gate, the on-time for a power switch is extended until an on-time signal provided by a summing comparator circuit (with ramp compensation turned off) goes low. Once the on-time signal goes low, the AND gate allows the off-time signal to propagate to a latch included with or coupled to the switch driver circuit. As desired, the on-time extension feature is combinable with other control signals such as a time-out signal (a maximum on-time) and an overcurrent condition detection signal. Such control signals may be OR gated with the output of the AND gate to control when to turn off a power switch. To provide a better understanding, various switching converter issues, on-time extension issues, and related circuits or systems are described using the figures as follows.

FIG. 1 is a graph 100 showing switching converter output voltage as a function of input voltage in accordance with some examples. In graph 100, curves 102, 104 represent "dropout" curves for a high-frequency switching converter without on-time compensation. Meanwhile, the curve 106 represents the dropout curve for a high-frequency switching converter with on-time compensation as described herein. With the dropout curve behavior represented in curve 102, the output current (IOUT) is 3.0 A. As represented with curve 102, a VIN of approximately 8.7V or above is sufficient to sustain a VOUT that is regulated around 5V. With the dropout curve behavior represented in curve 104, IOUT is 1.5 A. As represented with curve 104, a VIN of approximately 8.3V or above is sufficient to sustain a VOUT that is regulated around 5V. With the dropout curve behavior represented in curve 106, the output current (IOUT) is 3.0 A. As represented with curve 106, a VIN of approximately 6.8V or more is sufficient to sustain a VOUT that is regulated around 5V. In a battery-based circuit, the result of using the disclosed analog on-time extension circuit is that the battery will last longer since the battery can lose more charge and still maintain a desired VOUT (e.g., 5V in the example of FIG. 1).

Figure 2:
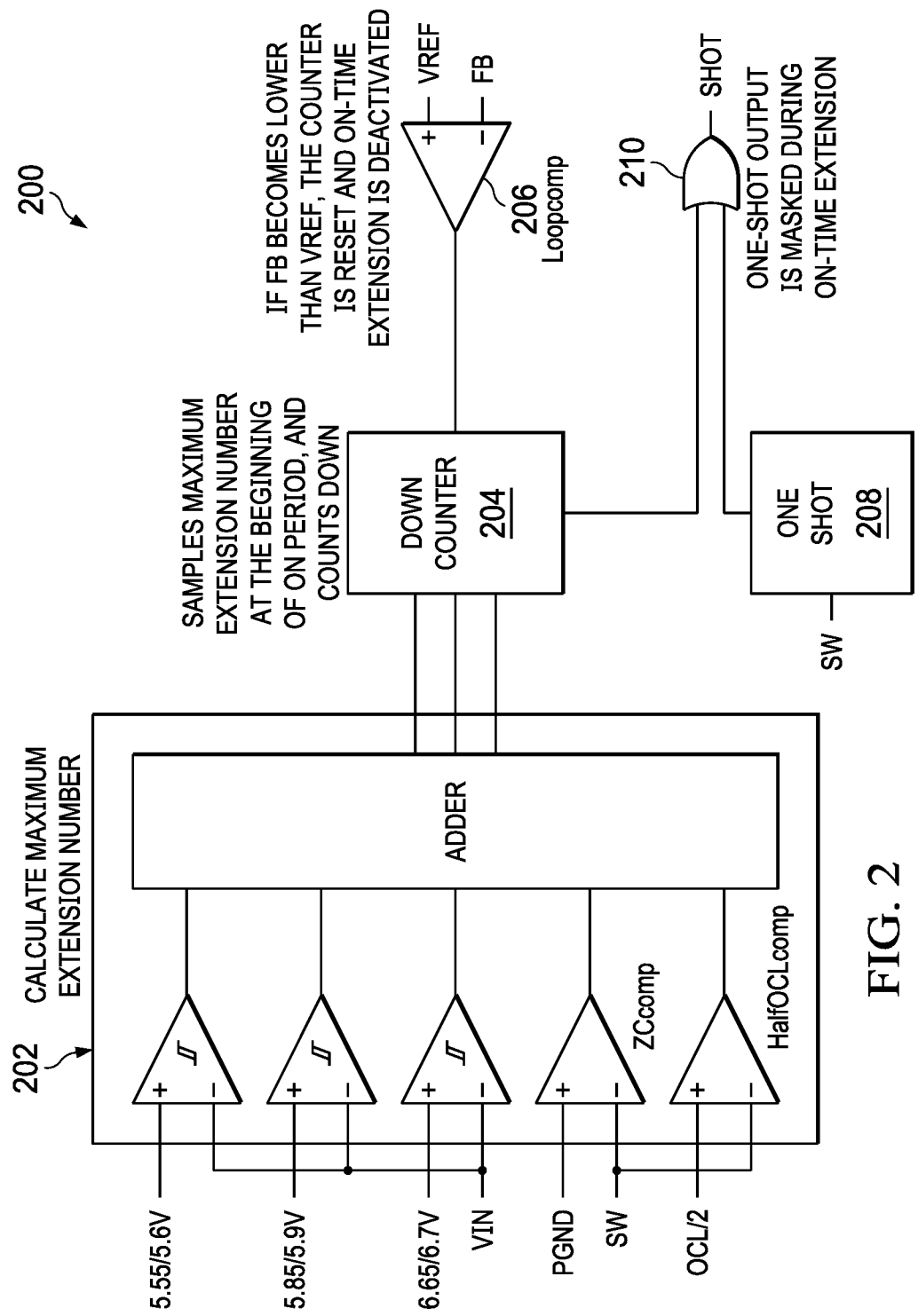
FIG. 2 is a schematic diagram showing a digital on-time extension circuit in accordance with some examples.

FIG. 2 is a schematic diagram showing a digital on-time extension circuit 200 in accordance with some examples. The digital on-time extension circuit 200 includes a first circuit 202 configured to determine a maximum on-time extension number based on comparing VIN to different thresholds. In the example of FIG. 2, the first circuit 202 includes various comparators and an adder. The upper comparators in the first circuit 202 compare VIN to different thresholds. Also, the ZCcomp comparator provides inductor current zero cross detection, and the HalfOCLcomp provide provides over current protection of a low-side switch. The down counter 204 is configured to sample the maximum on-time extension number determined by the first circuit 202 at the beginning of an on period and counts down. If the feedback voltage goes lower that VREF, the down counter 204 is reset and the on-time extension is deactivated. During the on-time extension, the output of a one-shot timer 208 is masked by the OR gate 210. The one-shot timer 208 can be reset by a control signal. The digital on-time extension circuit 200 is more complicated than desired, which results in a larger circuit and higher cost.

Figure 3:
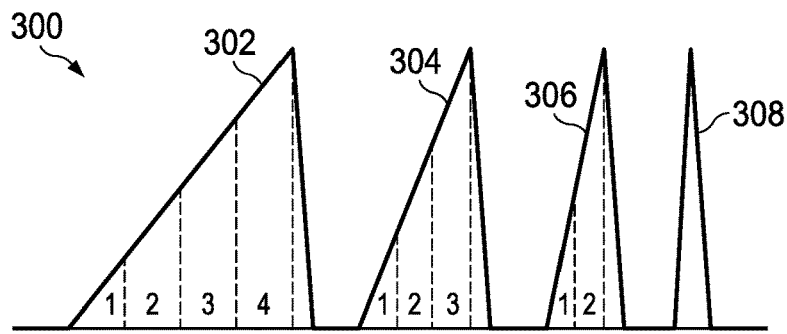
FIG. 3 is a graph showing on-time extension options based on the digital on-time extension circuit of FIG. 2 in accordance with some examples.

FIG. 3 is a graph 300 showing on-time extension options based on the digital on-time extension circuit of FIG. 2 in accordance with some examples. In graph 300, a first interval 302 represents an on-time extension of 4*TON that is used when VIN=5.55 to 5.6V. A second interval 304 represents an on-time extension of 3*TON that is used when VIN=5.85 to 5.9V. A third interval 306 represents an on-time extension of 2*TON that is used when VIN=6.65 to 6.7V. A third interval 306 represents an on-time extension of 1*TON (no time extension) that is used when VIN=15V. The selection of digital on-time extension options by the digital on-time extension circuit 200 is not continuous, resulting in $I_L$ and VOUT instability as represented in FIG. 4.

Figure 4:
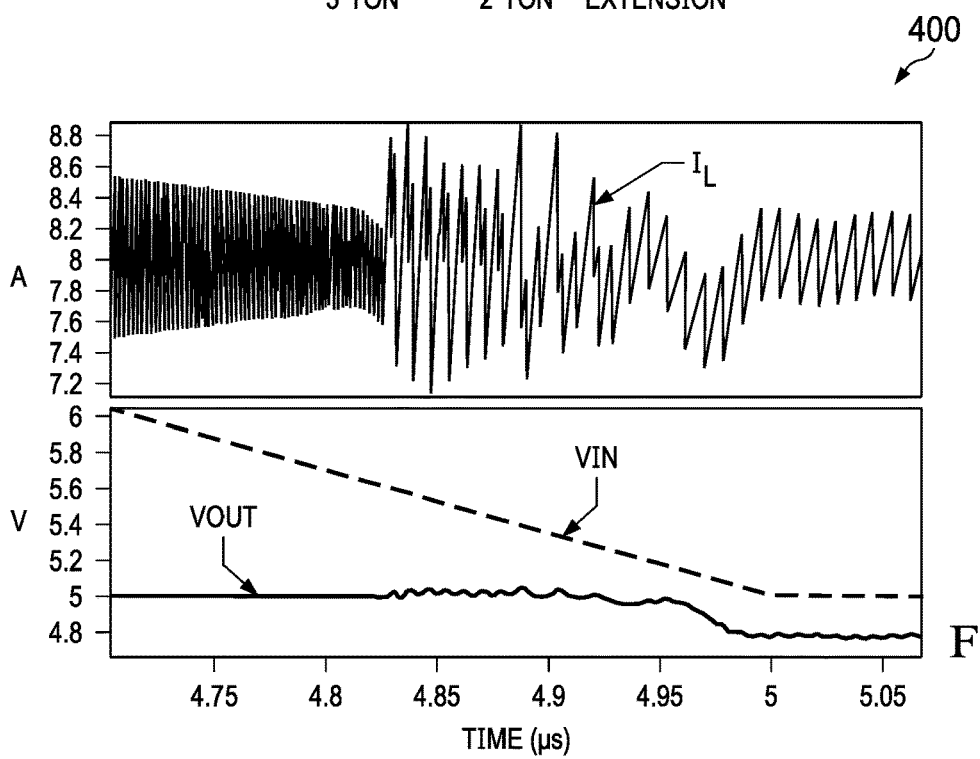
FIG. 4 is a timing diagram showing inductor current and output voltage instability as input voltage drops over time in accordance with some examples.

FIG. 4 is a timing diagram 400 showing inductor current and output voltage instability as input voltage drops over time in accordance with some examples. In the timing diagram 400, the inductor current ($I_L$) destabilizes when VIN drops below 5.6V, where the result of $I_L$ instability is inefficiency as well as undesirable VOUT ripple. The timing diagram 400 is representative of instability issues involving the digital on-time extension circuit 200.

Figure 5:
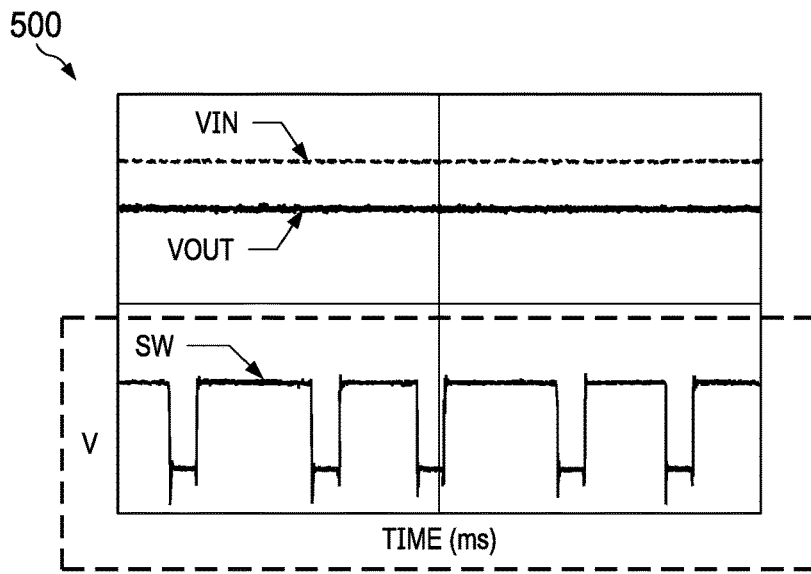
FIG. 5 is a timing diagram showing switching instability as a function of time due to low input voltage in accordance with some examples.

FIG. 5 is a timing diagram 500 showing switching instability as a function of time due to low input voltage in accordance with some examples. In the timing diagram 500, a scenario is represented in which VIN is close to VOUT, resulting in switch node (SW) voltage instability. As shown in the diagram 500, the waveform of switching node (SW) is not periodically stable. As previously noted, SW, instability (see e.g., FIG. 4) is due to the selection of digital on-time extension options by the digital on-time extension circuit 200 not being continuous.

Figure 6:
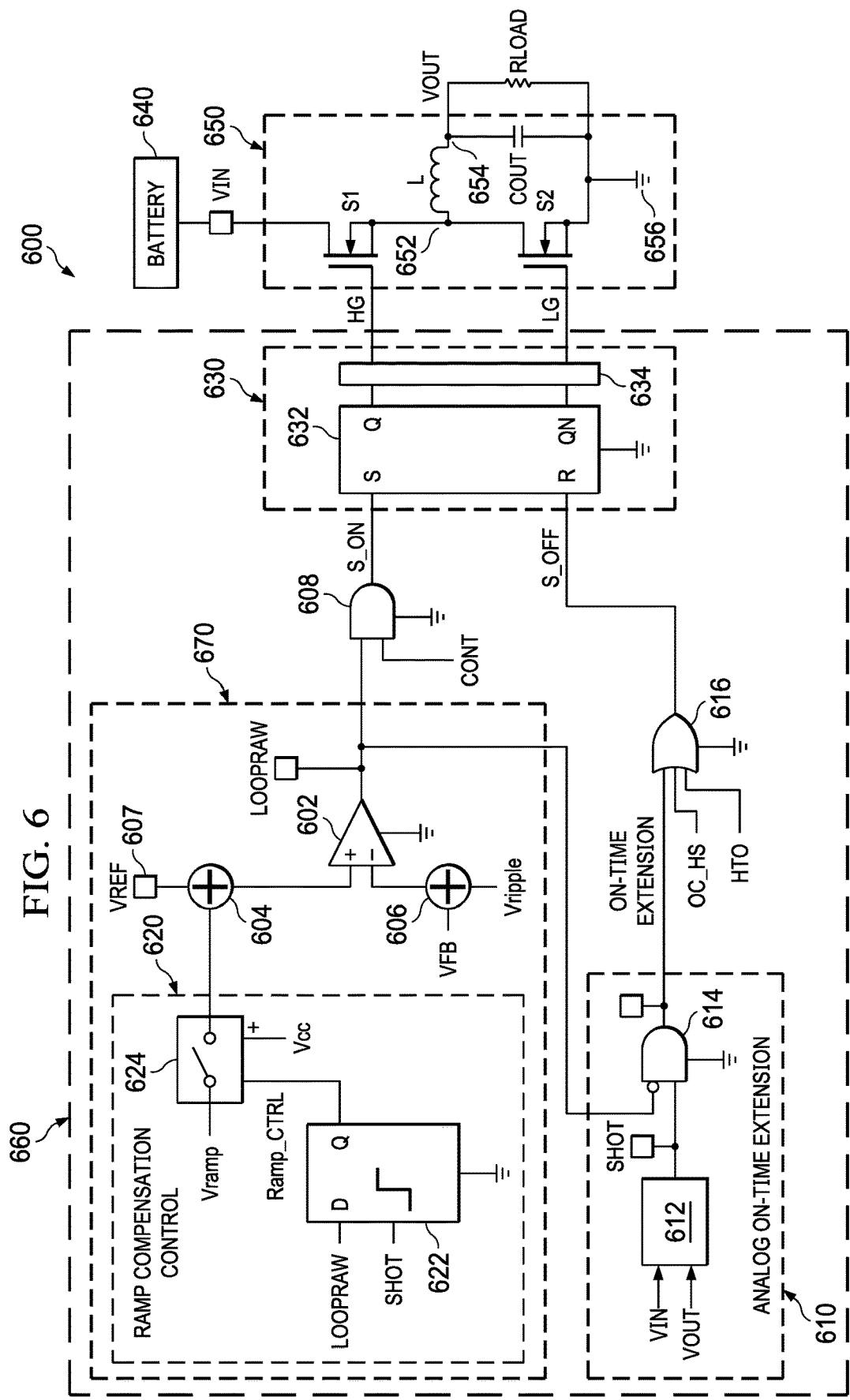
FIG. 6 is a diagram of a system in accordance with some examples.

FIG. 6 is a diagram of a system 600 in accordance with some examples. As shown, the system 600 includes switching converter circuitry 650 and a control circuit 660 for one or more power switches (e.g., S1 or S2) of the switching converter circuitry 650. In the example of FIG. 6, the switching converter circuitry 650 corresponds to a buck converter topology with a high-side switch (S1), a low-side switch (S2), an inductor (L), and an output capacitor (COUT). In other examples, the switching converter circuitry 650 could have a boost converter topology, or any other switching converter topology.

As shown, S1 and S2 are coupled between a battery 640 configured to provide VIN and a ground node 656. Also, a first end of L is coupled to a switch node 652 between S1 and S2. Also, a second end of L is coupled to an output node 654. Also, COUT and a load (RLOAD) are coupled in parallel between the output node 654 and a ground node. In a first phase (S1 on, S2 off) of the switching converter circuitry 650, the inductor current ($I_L$) ramps up. In a second phase (S1 off, S2 on), $I_L$ ramps down. To regulate VOUT at the output node 654, the timing of the first and second phases is controlled by the control circuit 660. As the VIN provided by the battery 640 drops, the control circuit 660 adjusts the timing of the first and second phases to account this change (e.g., by increasing the total amount of phase 1 time subject to certain limits such as a minimum off-time).

In the example of FIG. 2, as VIN drops, the switching converter touches the minimum off time. There is a need to increase on time in order to maintain VOUT within a desired target window. Accordingly, in the example of FIG. 6, the control circuit includes an analog on-time extension circuit 610 configured to extend an on-time, which helps VOUT regulate normally, which means VOUT follows the set reference value without significant instability issue. The on-time signal generator circuit 612 generates a one-shot signal SHOT based on VIN and VOUT, where SHOT is input into an AND gate 614. In some examples, on-time signal generator circuit 612 is a comparator with two inputs. One input is charging the timing capacitor with a current proportional to VIN and the other input is VOUT. The comparator output will become high when the voltage across the timing capacitor becomes VOUT. In some examples, the other input into the AND gate 614 is an on-time signal (LOOPRAW) provided by an on-time signal generator circuit 670, where the AND gate 614 is configured to receive LOOPRAW via an inverter or is otherwise configured to gate SHOT based on the inverted version of LOOPRAW. Thus, SHOT is allowed to propagate forward only when LOOPRAW is low. This means LOOPRAW (switch on indicator) being high has higher priority than SHOT (switch off indicator) being high to control the high-side switch (S1).

In operation, the analog on-time extension circuit 610 uses the output of summing comparator 670 (LOOPRAW) to gate the output of the on-time generator circuit 612 (SHOT). For example, SHOT is a pulse width modulated signal that is used to control when phase 1 ends and phase 2 begins. As shown, the analog on-time extensions circuit 610 includes an AND gate 614 that receives SHOT as an input. By using LOOPRAW to gate SHOT using the AND gate 614, the analog on-time extension circuit 610 is able to extend phase 1 depending on the other input into the AND gate 614.

In the example of FIG. 6, the output of the AND gate 614 is provided to a latch 632. The latch 632 is coupled to is part of (as shown) a switch driver circuit 630 configured to provide a high-side drive signal (HG) to S1 and to provide a low-side drive signal (LG) to S2. For example, the Q and QN outputs of the latch 632 can be provided to a driver circuit 634, which is configured to provide sufficient current to drive S1 and S2. Thus, when the latch 632 receives the SHOT signal, the switch driver circuit 630 directs the switching converter circuitry 650 to transition to phase 2 (S1 off, S2 on). In some examples, the latch 632 is an SR latch with a set (S) input node and a reset (R) input node, where the R input node is configured to receive the SHOT signal. As shown, the R input node is coupled to an OR gate 616 that passes the SHOT signal to the R input node of the latch 632. The OR gate 616 also receives as an input a high-side overcurrent condition detection signal (OC_HS) that indicates when an overcurrent condition exists. In some examples, OC_HS is provided by an overcurrent detection circuit coupled to one of the current terminals of S1. As shown, the OR gate 616 also receives as an input a time-out signal (HTO) that indicates when a maximum on-time limit has been reached. In some examples, HTO is provided by a programmable timer that allows customization of the maximum on-time limit (affecting the dropout of VOUT relative to VIN).

As previously noted, the summing comparator circuit 670 is configured to provide LOOPRAW, which is used by the analog on-time extension circuit 610 to gate SHOT. As shown, LOOPRAW is also gated by an AND gate 608, where a minimum off-time signal (CONT) determines when LOOPRAW is propagated to the S input node of the latch 632. In some examples, CONT is provided by a minimum off-time signal generator (not shown). Often the minimum off-time is a fixed value in an IC specification. When the minimum off-time of the low-side switch arrives, CONT is asserted.

In the example of FIG. 6, the summing comparator circuit 670 comprises a comparator 602 that compares a feedback voltage (VFB) with a target reference voltage (VREF). More specifically, the positive input node of the comparator 602 is configured to receive VREF from a voltage reference source 607. Meanwhile, the negative input node of the comparator 602 is configured to receive VFB (e.g., via a feedback loop that connects to the output node 654 of the switching converter circuitry 650). Also, VREF may be modified based on a ramp compensation signal (Vramp) that is selectively applied to VREF by an adder circuit 604. Meanwhile, VFB may be modified based on a ripple signal (Vripple) that is applied to VFB by an adder circuit 606.

To selectively apply Vramp to VREF, the summing comparator circuit 670 includes a ramp compensation control circuit 620. In the example of FIG. 6, the ramp compensation control circuit 620 includes a ramp switch 624 controlled by the output (Ramp_CTRL) of a latch 622. In some examples, the latch 622 is a D latch, where the data input (D) node is configured to receive LOOPRAW, and where the enable node is configured to receive SHOT. With the D latch, Ramp_CTRL goes low whenever the on-time is being extended. When the on-time is not extended (e.g., during normal operations, and/or when VIN is greater than threshold), Ramp_CTRL is high such that Vramp is added to VREF for the comparison performed by the comparator 602. Also, during a transition interval (e.g., valley control mode to peak control mode) described herein, Ramp_CTRL may cycle up and down as needed to ensure $I_L$ stability.

Figure 7:
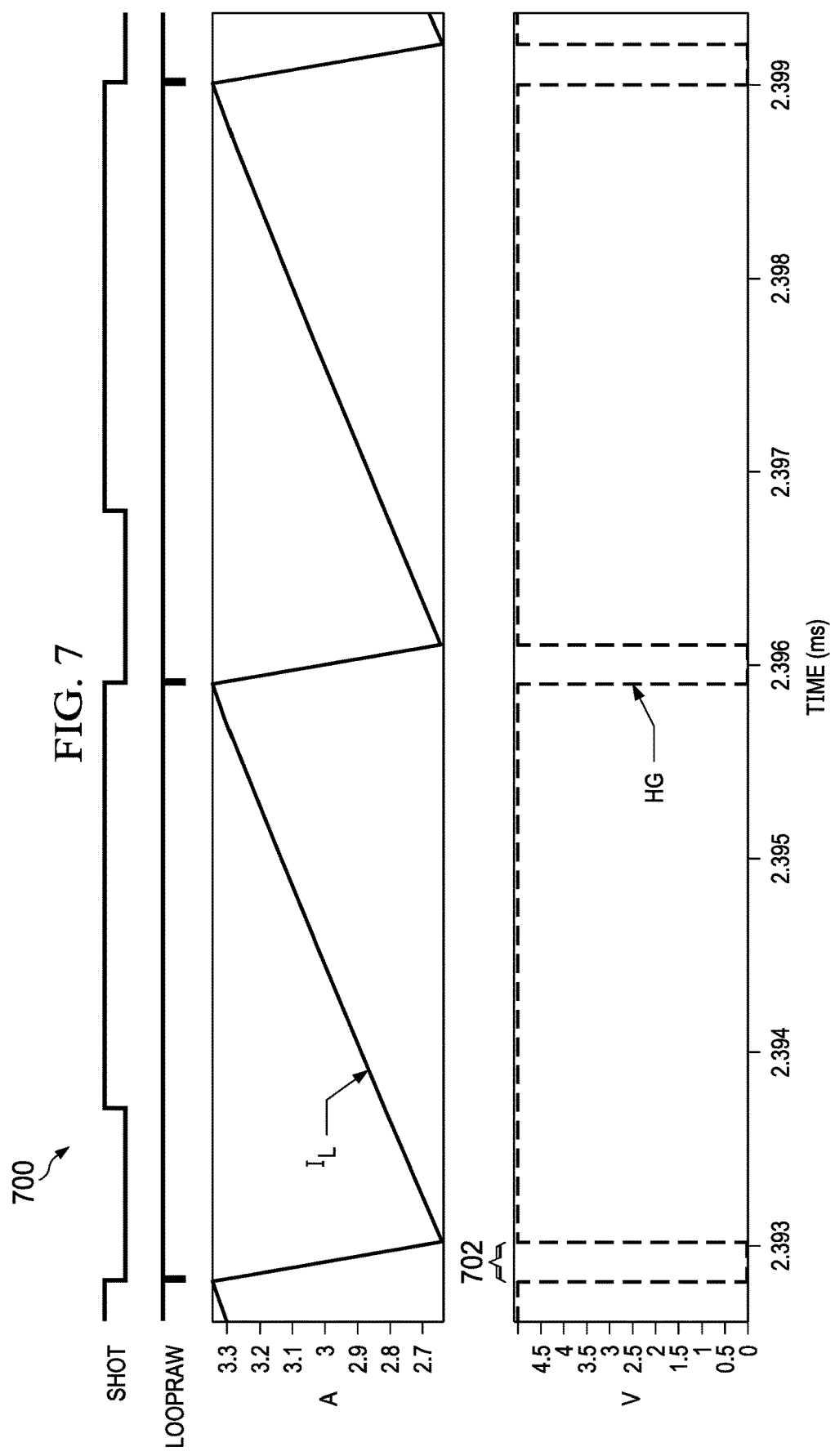
FIG. 7 is a timing diagram showing waveforms related to on-time extension for the system of FIG. 6 in accordance with some examples.

FIG. 7 is a timing diagram 700 showing waveforms related to on-time extension for the system of FIG. 6 in accordance with some examples. In the timing diagram 700, waveforms for SHOT, LOOPRAW, $I_L$, and HG are represented, where on-time extension is in use as described herein. During an on-time extension, HG transitions from high-to-low when SHOT is high and LOOPRAW goes low. Once HG goes low, HG stays low for a minimum off-time interval 702 and $I_L$ ramps down. After the minimum off-time interval 702, HG transitions from low-to-high in response to LOOPRAW being high, and $I_L$ ramps up. This control scheme is repeated in the timing diagram 700

Figure 8:
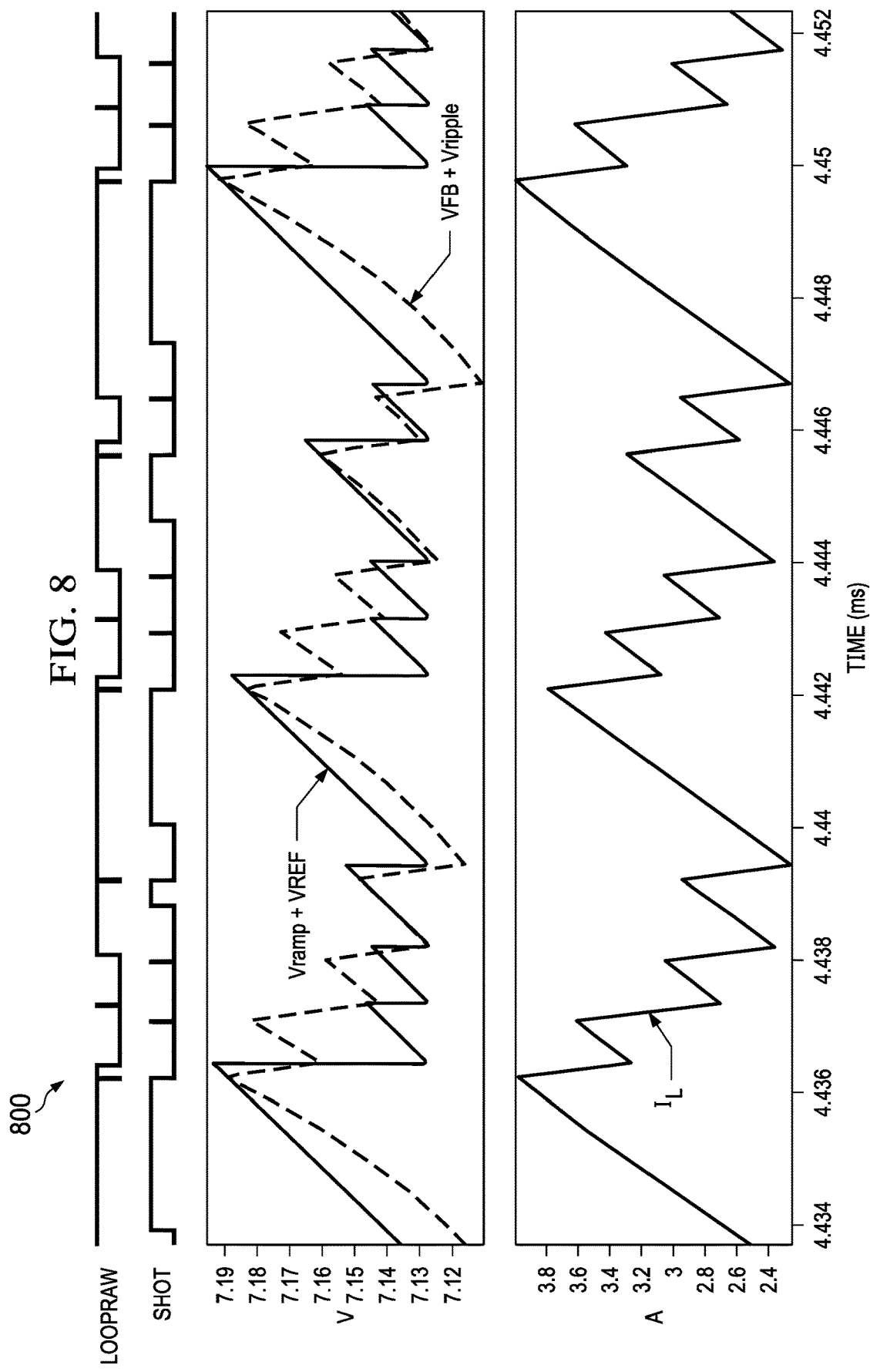
FIG. 8 is a timing diagram showing waveforms indicating inductor current instability during on-time extension with ramp compensation in use in accordance with some examples.

FIG. 8 is a timing diagram 800 showing waveforms indicating inductor current instability during on-time extension with ramp compensation in use in accordance with some examples. In the timing diagram 800, waveforms for LOOPRAW, SHOT, VRAMP+VREF, VFB+Vripple, and $I_L$ are represented. When ramp compensation is used during on-time extension, the relative values of VRAMP+VREF versus VFB+Vripple overlap and change quite often, resulting instability in LOOPRAW, SHOT, and $I_L$. The instability represented in the timing diagram 800 is representative of a switching converter transitioning back and forth between a valley control mode and a peak control mode.

Figure 9:
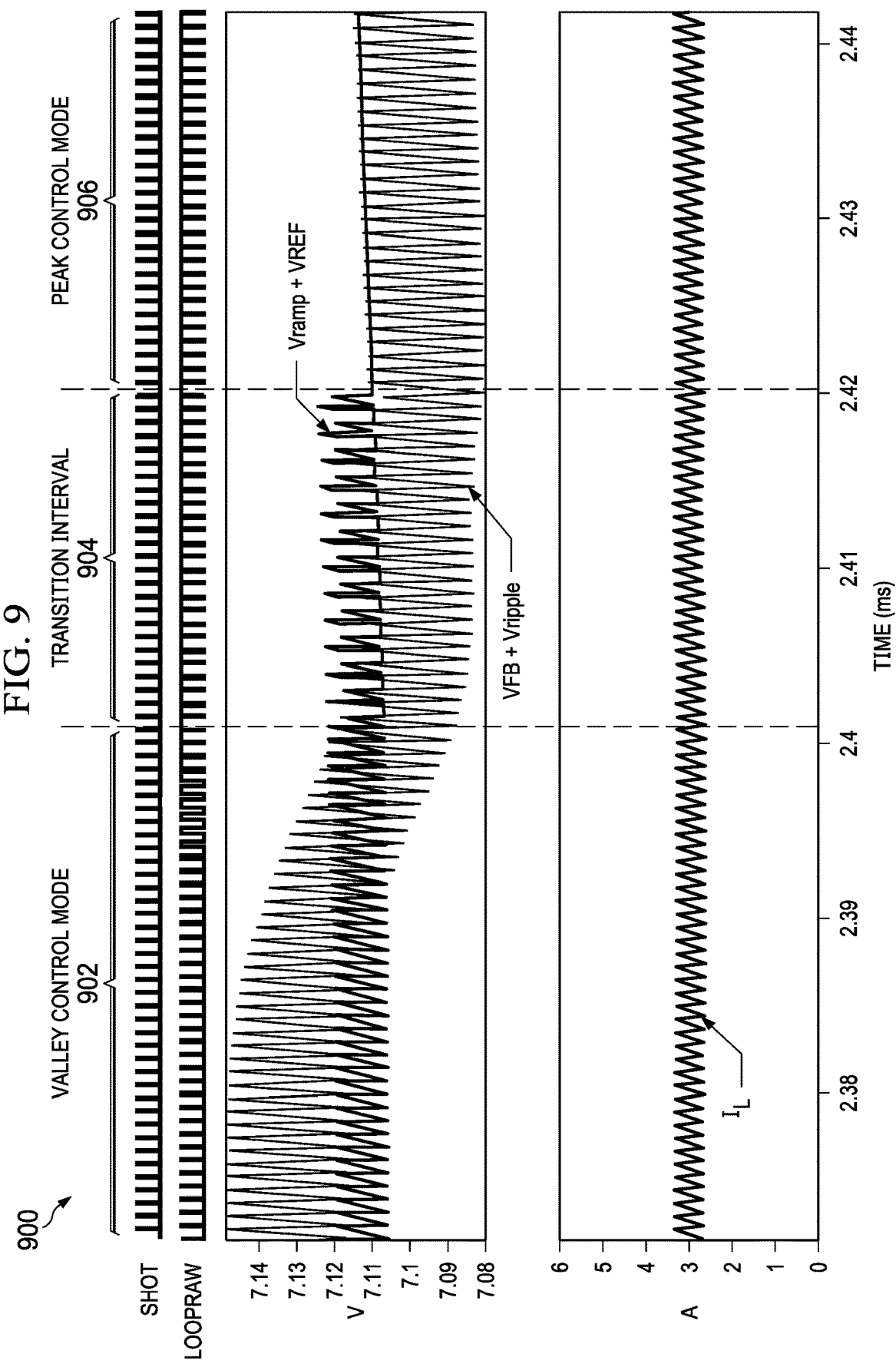
FIG. 9 is a timing diagram showing waveforms related to different switching converter modes in accordance with some examples.

FIG. 9 is a timing diagram 900 showing waveforms related to different switching converter modes in accordance with some examples. In the timing diagram 900, waveforms for LOOPRAW, SHOT, VRAMP+VREF, VFB+Vripple, and $I_L$ are represented. Initially, ramp compensation is used during interval 902, which corresponds to a valley control mode. In the valley control mode, VFB+Vripple is compared with Vramp+VREF. When VFB+Vripple hits the valley of Vramp+VREF, LOOPRAW is asserted or goes "high", which means the high-side switch should be turned on. As the on-time duration of LOOPRAW increases, the on-time extension feature described herein is employed during interval 906, and ramp compensation is turned off to avoid the instability issues noted with regard to FIG. 8. Accordingly, in the timing diagram 900, ramp compensation is turned off during interval 906, which corresponds to a peak control mode. In the peak control mode, VFB+Vripple is compared with VREF. When VFB+Vripple hits the peak of VREF, LOOPRAW is de-asserted or goes "low", which means the high-side switch should be turned off. Between the intervals 902 and 906 is a transition interval 904, where the on-time duration of LOOPRAW is greater than the on-time duration of LOOPRAW during the interval 902. To smoothly transition between the intervals 902 and 906, ramp compensation can be on/off modulated during the transition interval 904.

Figure 10:
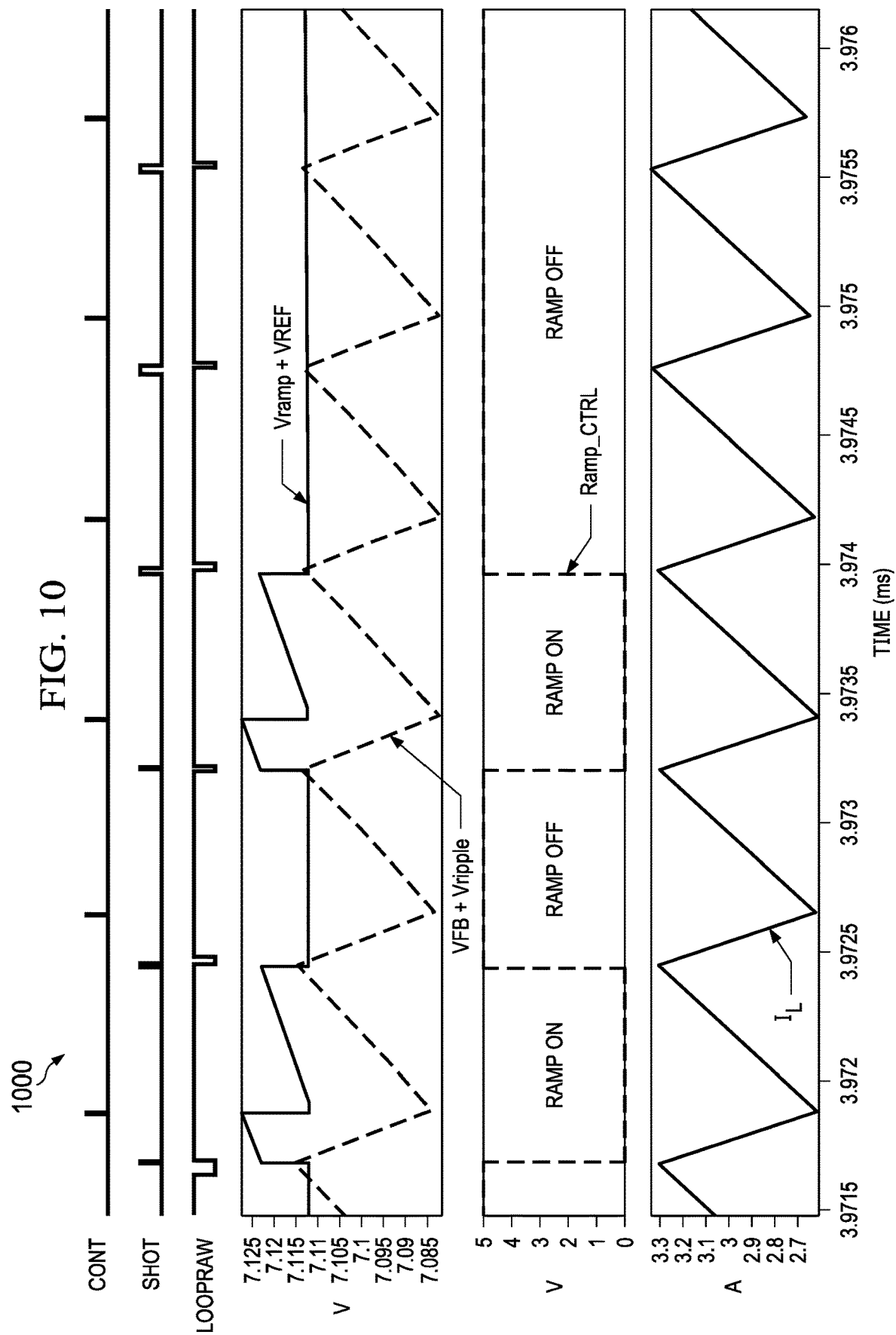
FIG. 10 is a timing diagram showing waveforms related to a transition interval between different switching converter modes in accordance with some examples.

FIG. 10 is a timing diagram 1000 showing waveforms related to a transition interval between different switching converter modes in accordance with some examples. In the timing diagram 1000, waveforms for CONT, LOOPRAW, SHOT, VRAMP+VREF, VFB+Vripple, Ramp_CTRL, and $I_L$ are represented. In the timing diagram 1000, the value of CONT determines when a high-side switch (e.g., S1 in FIG. 6) is turned on. If ramp compensation is turned off, the value of SHOT determines when a high-side switch (e.g., S1 in FIG. 6) is turned off. If ramp compensation is turned on, the rising edge of SHOT will switch off the ramp compensation so as to turn off the high-side switch. In this manner, adjustments to the ramp compensation is performed smoothly without instability. As desired, ramp compensation can be totally turned off because the rising edge of SHOT can always trigger LOOPRAW=1.

Figure 11:
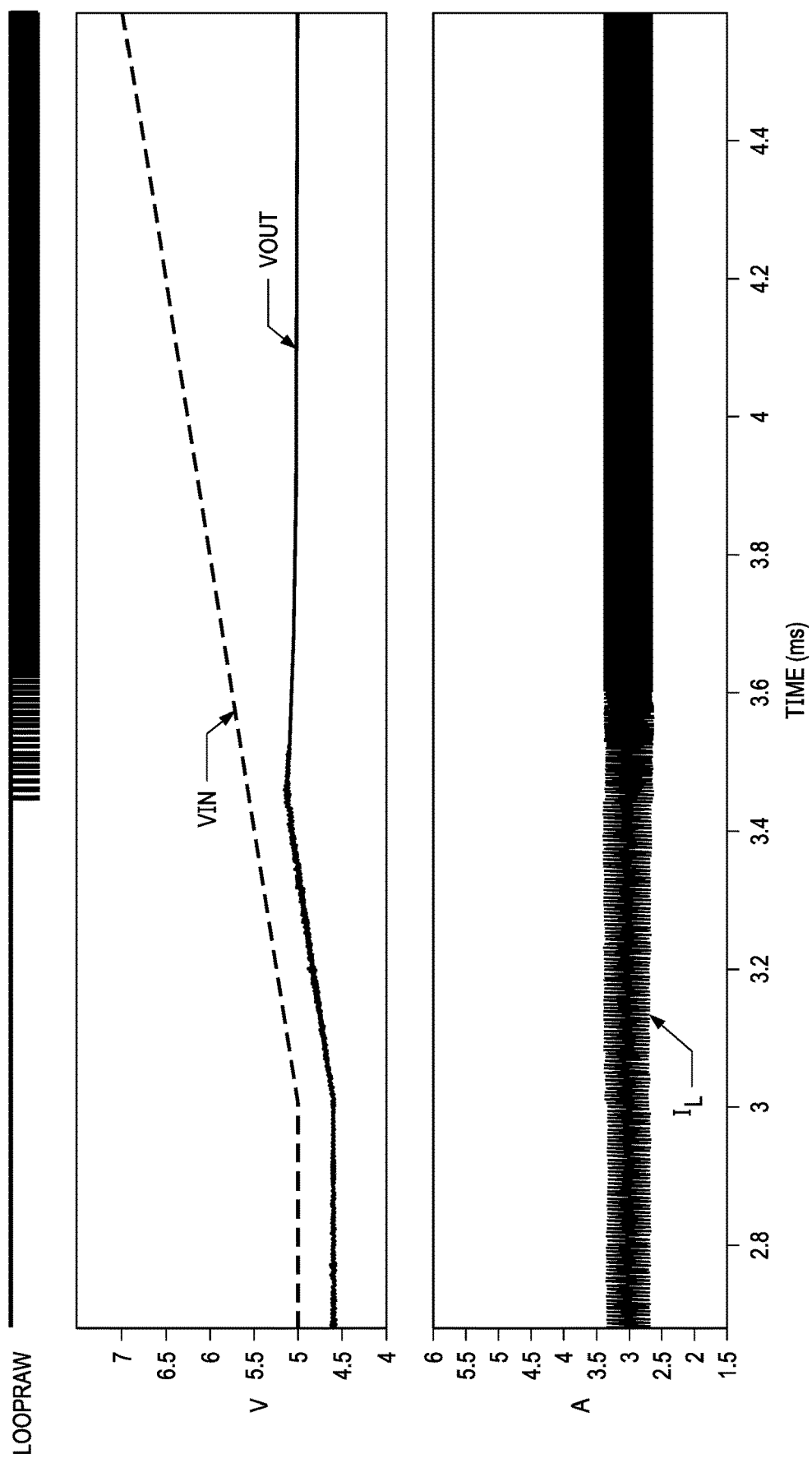
FIG. 11 is a timing diagram showing waveforms indicating inductor current stability during on-time extension operations in accordance some examples.

FIG. 11 is a timing diagram 1100 showing waveforms indicating inductor current stability during on-time extension operations in accordance some examples. In the timing diagram 1100, waveforms for LOOPRAW, VIN, VOUT, and $I_L$ are represented, where on-time extensions are initially needed. Later, VIN increases, which allows VOUT to settle around 5V. As represented in the timing diagram 1100, use of the analog on-time extension features described herein does not cause instability in VOUT or $I_L$.

Figure 12:
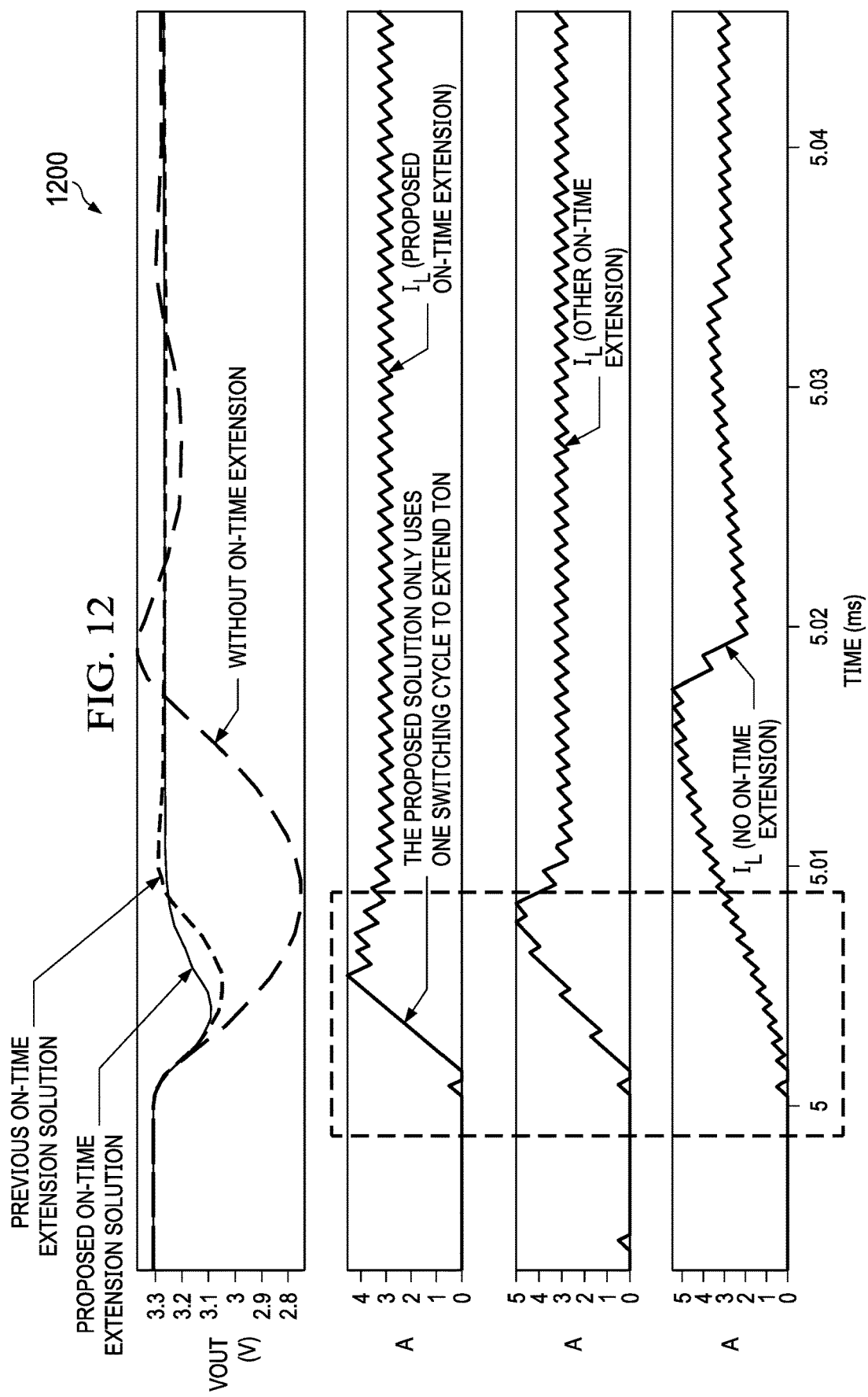
FIG. 12 is a timing diagram showing a comparison of output voltage and inductor current waveforms for different on-time extension options in accordance with some examples.

FIG. 12 is a timing diagram 1200 showing a comparison of output voltage and inductor current waveforms for different on-time extension options in accordance with some examples. As shown in the timing diagram 1200, the proposed on-time extension features allows VOUT to recover more quickly compared to VOUT recovery when another on-time extension feature (e.g., the digital on-time extension circuit of FIG. 2) or no on-time extension feature is used. This quick recovery of VOUT is due to the ramp of $I_L$ being smoother with the proposed on-time extension feature compared the ramp of $I_L$ when another on-time extension feature (e.g., the digital on-time extension circuit of FIG. 2) or no on-time extension feature is used.

Figure 13:
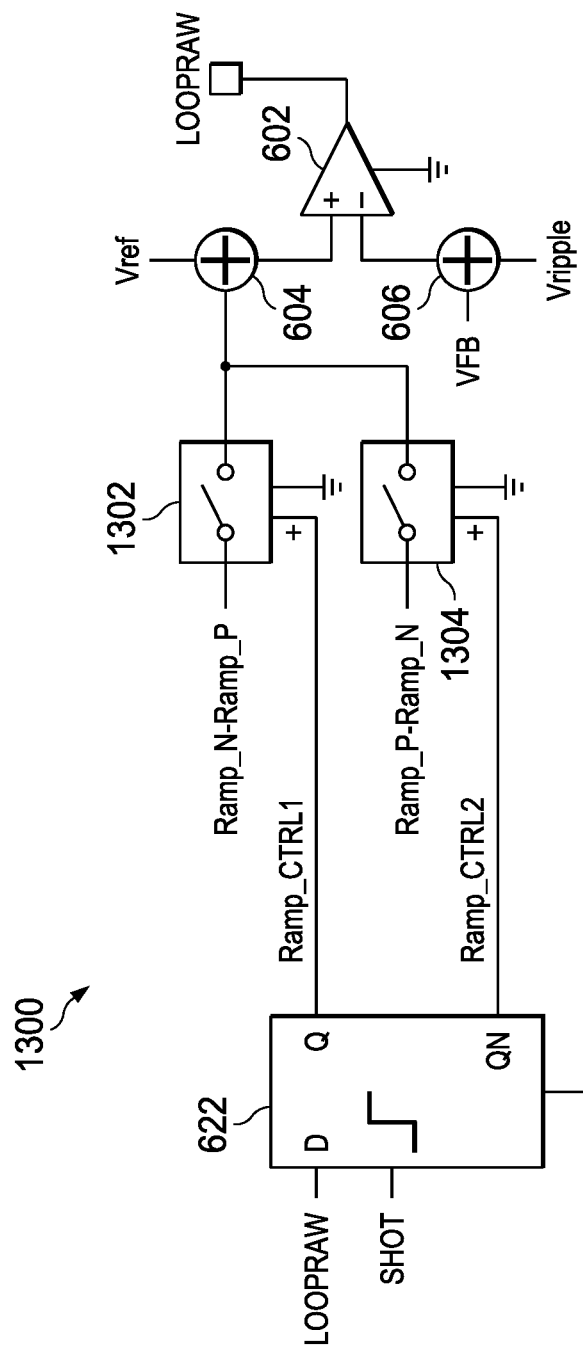
FIG. 13 is a schematic diagram showing an on-time circuit adding ramp compensation to cancel jitter in accordance with some examples.

FIG. 13 is a schematic diagram showing another summing comparator circuit 1300 (an example of the summing comparator circuit 670 in FIG. 6) in accordance with some examples. As shown, the summing comparator circuit 1300 includes various components introduced in FIG. 6, including the comparator 602, the adder circuit 604, the adder circuit 606, and the latch 622. In the summing comparator circuit 1300, two ramp switches 1302 and 1304 are used. The first ramp switch 1302 is configured to pass a first ramp compensation signal (Ramp_N-Ramp_P) to the adder circuit 604 (to combine the first ramp compensation signal with VREF) as controlled by a first control signal (Ramp_CTRL1) from the Q output node of the latch 622. Meanwhile, the second ramp switch 1304 is configured to pass a second ramp compensation signal (Ramp_P-Ramp_N, which is 180 degrees out of phase with Ramp_N-Ramp_P) to the adder circuit 606 (to combine the second ramp compensation signal with VREF) as controlled by a second control signal (Ramp_CTRL2) from the QN output node of the latch 622. In the example of FIG. 13, each of the ramp switches 1302 and 1304 are coupled to a ground node, and the control signals (Ramp_CTRL1 and Ramp_CTRL2) are represented as being positive (+) signals. This is the case, for example, where the ramp switches 1302 and 1304 correspond to transistors with grounded substrates, and where positive control signals at the respective control terminals are used to enable current flow through the ramp switches 1302 and 1304. With the summing comparator circuit 1300, jitter can be canceled (e.g., during a transition interval) by on/off modulating ramp compensation automatically in dropout scenarios.

Figure 14:
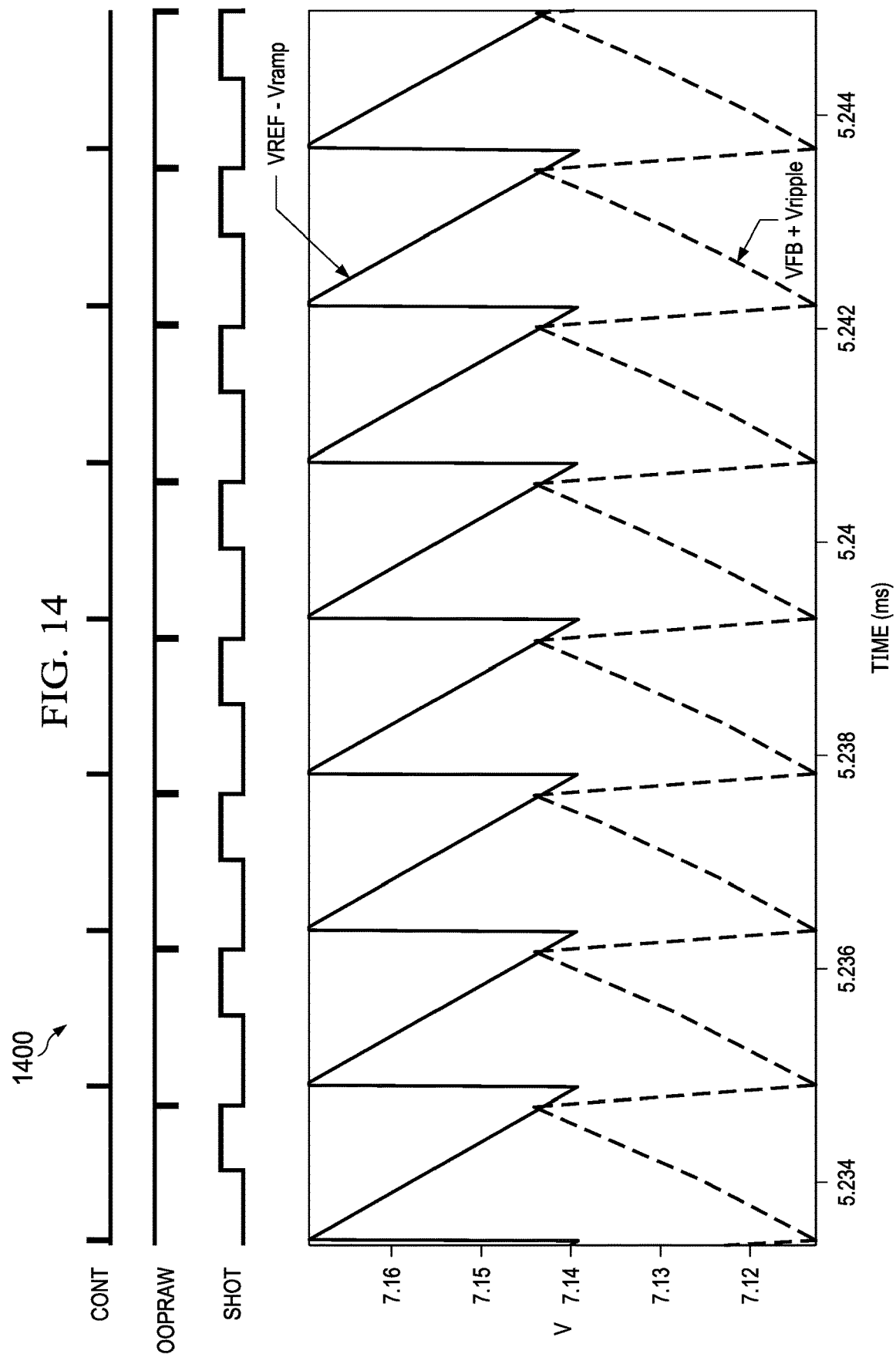
FIG. 14 is a timing diagram showing waveforms related to ramp compensation phase changes in accordance with some examples.

FIG. 14 is a timing diagram 1400 showing waveforms related to ramp compensation phase changes in accordance with some examples. More specifically, the timing diagram includes waveforms for CONT, LOOPRAW, SHOT, VREF-Vramp, and VFB+Vripple. As represented in the timing diagram 1400, the phase of ramp compensation can be changed automatically in dropout scenarios.

In some examples, a system (e.g., the system 600 in FIG. 6) includes a battery (e.g., the battery 640 in FIG. 6) configured to provide VIN. The system also includes a switching converter (e.g., the switching converter circuitry 650 in FIG. 6) coupled to the battery, where the switching converter includes a power switch (e.g., S1 or S2 in FIG. 6). The system also includes a load (e.g., RLOAD in FIG. 6) coupled to an output of the switching converter. The system also includes a control circuit 660 coupled to the power switch. The control circuit includes a switch driver circuit (e.g., the switch driver circuit 630 in FIG. 6) coupled to the power switch. The control circuit also includes summing comparator circuit (e.g., the summing comparator circuit 670 in FIG. 6) configured to output a first control signal (e.g., LOOPRAW in FIG. 6) that indicates when to turn the power switch on. The control circuit also includes an analog on-time extension circuit (e.g., the AND gate 614 in FIG. 6) configured to extend an on-time of the power switch by gating a second control signal (e.g., SHOT in FIG. 6) with the first control signal, wherein the second control signal is separate from the first control signal, and wherein the second control signal indicates when to turn the power switch off.

In some examples, the control circuit (e.g., 660 in FIG. 6) includes an on-time signal generator circuit (e.g., the on-time signal generator circuit 612 in FIG. 6) coupled to or included with the analog on-time extension circuit, wherein the on-time signal generator circuit provides the second control signal based on VOUT of the switching converter and VIN. In some examples, the summing comparator circuit includes a comparator (e.g., the comparator 602 in FIG. 6) coupled to the analog on-time extension circuit, wherein the comparator is configured to output the first control signal based on comparison results of a reference signal (e.g., VREF in FIG. 6) and a feedback signal (e.g., VFB in FIG. 6), where the reference signal selectively includes ramp compensation (e.g., Vramp in FIG. 6). In some examples, the summing comparator circuit also includes a ramp compensation control circuit (e.g., the ramp compensation control circuit 620 in FIG. 6) coupled to a positive input of the comparator. The ramp compensation control circuit includes: 1) a ramp switch (e.g., the ramp switch 624 in FIG. 6) configured to selectively pass a ramp compensation signal; and 2) a latch (e.g., the latch 622 in FIG. 6) configured to control the ramp switch based on the first control signal and the second control signal. In some examples, the latch comprises a D latch with a data input node and an enable input node, wherein the data input node is configured to receive the first control signal, and wherein the enable input node is configured to receive the second control signal.

In some examples, the summing comparator circuit comprises a ramp compensation control circuit (e.g., the ramp compensation control circuit 620 in FIG. 6) coupled to a positive input of the comparator, wherein the ramp compensation control circuit is configured to provide ramp compensation during a valley control mode in which the on-time is not extended, to modulate ramp compensation during a transition interval, and to pause ramp compensation during a peak control mode in which the on-time is being extended.

In some examples, the analog on-time extension circuit comprises an AND gate (e.g., the AND gate 614 in FIG. 6), wherein a first input node of the AND gate is configured to receive the second control signal, and wherein a second input node of the AND gate is configured to receive an inverted version of the first control signal. In some examples, the switch driver circuit (e.g., the switch driver circuit 630) comprises an SR latch (e.g., the latch 632 in FIG. 6), wherein an S input node of the SR latch is configured to receive a switch-on signal (e.g., S_ON in FIG. 6), and wherein an R input node of the SR latch is configured to a switch-off signal (S_OFF in FIG. 6). In some examples, the AND gate (e.g., the AND gate 614 in FIG. 6) is a first AND gate, and wherein the switch-on signal is provided by a second AND gate (e.g., the AND gate 608 in FIG. 6) configured to gate the first control signal with a minimum off-time control signal (e.g., CONT in FIG. 6). In some examples, the system also includes an OR gate (e.g., the OR gate 616 in FIG. 6) configured to provide the switch-off signal, wherein inputs to the OR gate include: 1) an output of the first AND gate (e.g., the AND gate 614 in FIG. 6); and 2) a time-out signal (e.g., HTO in FIG. 6) that indicates when a maximum on-time threshold is reached. In some examples, a switching converter (e.g., an integrated circuit, a packaged chip, a multi-die module, a printed circuit board (PCB) with integrated circuit components and/or discrete components) includes a power switch (e.g., S1 in FIG. 6). The switching converter also includes a control circuit (e.g., the control circuit 660 in FIG. 6) coupled to the power switch. The control circuit includes a switch driver circuit (e.g., the switch driver circuit 630 in FIG. 6), a summing comparator circuit (e.g., the summing comparator circuit 670 in FIG. 6), and an on-time signal generator circuit (e.g., the on-time signal generator circuit 612 in FIG. 6). The control circuit also includes an AND gate (e.g., the AND gate 614 in FIG. 6) with a first input node, a second input node, and an output node. The first input node of the AND gate is coupled to an inverted version of an output of the summing comparator circuit. The second input node of the AND gate is coupled to an output of the on-time signal generator circuit. The output node of the AND gate is coupled to the switch driver circuit.

In some examples, the summing comparator circuit (e.g., the summing comparator circuit 670 in FIG. 6) includes a comparator (e.g., the comparator 602) with a positive input node coupled to a reference voltage (e.g., from the voltage reference source 607 in FIG. 6) and with a negative input node coupled an output node (e.g., the output node 654 in FIG. 6) of the switching converter. The summing comparator circuit also includes a ramp compensation control circuit (e.g., the ramp compensation control circuit 620 in FIG. 6) coupled to the positive input node of the comparator, wherein the ramp compensation control circuit includes a ramp switch (e.g., the ramp switch 624 in FIG. 6) and a ramp switch controller (e.g., the latch 622 in FIG. 6). In some examples, the ramp switch controller comprises a D latch with a data input node and an enable node, wherein the data input node is coupled to the output of the summing comparator circuit, and wherein the enable node is coupled to the output of the on-time signal generator circuit. In some examples, the on-time signal generator circuit is configured to generate an off-time signal based on VOUT and VIN of the switching converter.

In some examples, the AND gate (e.g., the AND gate 614 in FIG. 6) is a first AND gate, and wherein the switching converter further comprises a second AND gate (e.g., the AND gate 608 in FIG. 6), wherein a first input node of the second AND gate is coupled to the output of the summing comparator circuit, and wherein a second input node of the second AND gate is coupled to a minimum off-time control signal (e.g., CONT in FIG. 6). In some examples, the switch driver circuit (e.g., the switch driver circuit 630 in FIG. 6) comprises an SR latch (e.g., the latch 632 in FIG. 6), wherein a set input node of the SR latch is coupled to an output of the second AND gate, and wherein a reset input node of the SR latch is coupled to an output of the first AND gate. In some examples, the switching converter also includes an OR gate coupled to the reset input node, wherein a first input node of the OR gate is coupled to the output of the first AND gate, and wherein a second input node of the OR gate is coupled to a maximum on-time control signal (e.g., HTO in FIG. 6). In some examples, a third input node of the OR gate is coupled to an overcurrent condition detection signal (e.g., OC_HS in FIG. 6).

In some examples, a switching converter controller (e.g., the control circuit 660 in FIG. 6) includes a latch (e.g., the latch 632 in FIG. 6) and an analog on-time extension circuit with an AND gate (e.g., the AND gate 614 in FIG. 6). A first input node of the AND gate is configured to receive an inverted on-time signal (e.g., LOOPRAW in FIG. 6). A second input node of the AND gate is configured to receive an off-time signal (SHOT in FIG. 6). The output node of the AND gate is coupled to the latch.

In some examples, the switching converter controller includes a comparator (e.g., the comparator 602 in FIG. 6) with a positive input node configured to receive a reference voltage (e.g., VREF in FIG. 6) and with a negative input node configured to receive a feedback voltage (VFB in FIG. 6). The switching converter controller also includes a ramp compensation control circuit (e.g., the ramp compensation control circuit 620 in FIG. 6) coupled to the positive input node of the comparator, wherein the ramp compensation circuit includes a ramp switch (e.g., the ramp switch 624 in FIG. 6) and a ramp switch controller (e.g., the latch 622 in FIG. 6). In some examples, the ramp switch controller comprises a D latch with a data input node and an enable node, wherein the data input node is configured to receive an output of the comparator (e.g., LOOPRAW in FIG. 6), and wherein the enable node is configured to receive the off-time signal (e.g., SHOT in FIG. 6).

In some examples, the switching converter controller includes an on-time signal generator circuit (e.g., the on-time signal generator circuit 612 in FIG. 6) coupled to the second input node of the AND gate. The on-time signal generator circuit is configured to generate the off-time signal based on a switching converter output voltage and a switching converter input voltage.

In some examples, the AND gate (e.g., the AND gate 614 in FIG. 6) is a first AND gate, and wherein the switching converter controller further comprises a second AND gate (e.g., the AND gate 608 in FIG. 6), wherein a first input node of the second AND gate is coupled to the output of the comparator, and wherein a second input node of the second AND gate is configured to receive a minimum off-time control signal (e.g., CONT in FIG. 6). In some examples, the latch (e.g., the latch 632) is an SR latch, wherein a set input node of the SR latch is coupled to an output of the second AND gate, and wherein a reset input node of the SR latch is coupled to an output of the first AND gate.

In some examples, switching converter controller includes an OR gate coupled to the reset input node of the SR latch, wherein a first input node of the OR gate is coupled to the output of the first AND gate (e.g., SHOT in FIG. 6, gated by LOOPRAW), wherein a second input node of the OR gate is configured to receive a maximum on-time control signal (e.g., HTO in FIG. 6), and wherein a third input node of the OR gate is configured to receive an overcurrent condition detection signal (e.g., OC_HS in FIG. 6). In some examples, the switching converter controller is an integrated circuit or packaged chip that can be used with one or more power switches (e.g., S1 or S2 in FIG. 6) of switching converter circuitry (e.g., the switching converter circuitry 650 in FIG. 6) as described herein.

With the disclosed analog on-time extension features, on-time extension is smoothly compared with digital on-time extension circuits and solves instability issues. The proposed solution is also easier to design and implement compared to digital on-time extension circuits. With the proposed analog on-time extension features, a good reference for on-time extension is provided along with improved transient dropout performance compared to other constant on-time controllers. Use of an analog solution is unique compared to digital on-time extension techniques. The proposed on-time extension solution uses analog driver logic to gate the on-time to avoid the discontinuity of the conventional digital method. Also, ramp compensation is adjusted when on-time is extended to avoid the interference from ramp compensation. The end equipment system, which may benefit from use of the disclosed switching converter topologies with an analog on-time extension circuit, can be battery operated consumer electronics, communication systems, and so on. Example benefits to the end equipment system include the support of low VIN scenarios (e.g., low battery voltage), and higher load transient performance, so that the operations of the end equipment system will not be interrupted during low battery and high load transient conditions.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
a battery configured to provide an input voltage;
a switching converter coupled to the battery, wherein the switching converter includes a power switch;
a control circuit coupled to the power switch, wherein the control circuit includes:
a switch driver circuit coupled to the power switch;
a comparator having a comparator output and first and second comparator inputs, wherein the comparator is configured to provide a first control signal at the comparator output to initiate turning the power switch on; and
an analog on-time extension circuit configured to extend an on-time of the power switch by gating a second control signal with the first control signal, wherein the second control signal is separate from the first control signal, and the second control signal initiates turning the power switch off.

2. The system of claim 1, wherein the control circuit further includes an on-time signal generator circuit having a generator input and a generator output, wherein the generator input is coupled to the analog on-time extension circuit, and the on-time signal generator circuit provides the second control signal at the generator output responsive to an output of the switching converter and the input voltage.

3. The system of claim 2, wherein the comparator is configured to provide the first control signal responsive to a comparison of a reference signal to a feedback signal, where the reference signal selectively includes ramp compensation.

4. The system of claim 3, further including a ramp compensation control circuit coupled to the first comparator input, wherein the ramp compensation control circuit includes:

a ramp switch configured to selectively pass a ramp compensation signal; and
a latch configured to control the ramp switch responsive to the first control signal and the second control signal.

5. The system of claim 4, wherein the latch includes a D latch with a data input terminal and an enable input terminal, wherein the data input terminal is coupled to the comparator output, and the enable input terminal is coupled to the generator output.

6. The system of claim 3, further comprising a ramp compensation control circuit coupled to the first comparator input, wherein the ramp compensation control circuit is configured to provide ramp compensation during a valley control mode in which the on-time is not extended, to modulate ramp compensation during a transition interval, and to pause ramp compensation during a peak control mode in which the on-time is being extended.

7. The system of claim 2, wherein the analog on-time extension circuit includes an AND gate having first and second AND inputs and an AND output, the first AND input is coupled to the generator output, and the second AND input is configured to receive an inverted version of the first control signal.

8. The system of claim 7, wherein the switch driver circuit includes an SR latch having an S input and an R input, wherein the S input is configured to receive a switch-on signal, and the R input is configured to receive a switch-off signal.

9. The system of claim 8, wherein the AND gate is a first AND gate, and wherein the switch-on signal is provided by a second AND gate configured to gate the first control signal with a minimum off-time control signal.

10. The system of claim 8, further comprising an OR gate having an OR output and first and second OR inputs, wherein the first OR input is coupled to the AND output, the second OR input is configured to receive a time-out signal indicating a maximum on-time threshold is reached, and the OR gate is configured to provide the switch-off signal at the OR output.

11. A switching converter controller comprising:
a latch; and
an analog on-time extension circuit that includes:
an on-time signal generator circuit having first and second on-time inputs and an on-time signal output, wherein the first on-time input is coupled to a switching converter input voltage terminal, and the second on-time input is coupled to a switching converter output voltage; and
an AND gate having an AND output and first and second AND inputs, wherein the first AND input is configured to receive an inverted on-time signal, the second AND input is coupled to the on-time signal output and is configured to receive an off-time signal, the AND output is coupled to the latch.

12. The switching converter controller of claim 11, further comprising:
a comparator having first and second comparator inputs and a comparator output, wherein the first comparator input is coupled to a reference voltage terminal providing a reference voltage, and the second comparator input is coupled to a feedback voltage; and
a ramp compensation control circuit including a ramp switch and a ramp switch controller, wherein the ramp compensation control circuit is coupled to the first comparator input.

13. The switching converter controller of claim 12, wherein the ramp switch controller includes a D latch having a data input terminal and an enable terminal, wherein the data input terminal is coupled to the comparator output, and the enable terminal is coupled to the second AND input.

14. The switching converter controller of claim 12, wherein the AND gate is a first AND gate and the AND output is a first AND output, the switching converter controller further includes a second AND gate having a second AND output and third and fourth AND inputs, the third AND input is coupled to the comparator output, and the fourth AND input is configured to receive a minimum off-time control signal.

15. The switching converter controller of claim 14, wherein the latch includes an SR latch having a set input and a reset input, wherein the set input is coupled to the second AND output, and the reset input is coupled to the first AND output.

16. The switching converter controller of claim 15, further comprising an OR gate having an OR output and first and second OR inputs, wherein the OR output is coupled to the reset input, the first OR input is coupled to the first AND output, the second OR input is configured to receive a maximum on-time control signal, and wherein a third input node of the OR gate is configured to receive an overcurrent condition detection signal.

* * * * *